(12) United States Patent
Pan

(10) Patent No.: US 11,380,413 B2
(45) Date of Patent: Jul. 5, 2022

(54) TEST SYSTEM AND TEST METHOD

(71) Applicant: CHANGXIN MEMORY TECHNOLOGIES, INC., Hefei (CN)

(72) Inventor: YiFei Pan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/504,836

(22) Filed: Oct. 19, 2021

(65) Prior Publication Data

US 2022/0076768 A1 Mar. 10, 2022

Related U.S. Application Data

(63) Continuation of application No. PCT/CN2021/103029, filed on Jun. 29, 2021.

(30) Foreign Application Priority Data

Sep. 7, 2020 (CN) .......................... 202010929507.0

(51) Int. Cl.
*G11C 29/02* (2006.01)
*G11C 29/50* (2006.01)

(52) U.S. Cl.
CPC .......... *G11C 29/023* (2013.01); *G11C 29/028* (2013.01); *G11C 29/50012* (2013.01)

(58) Field of Classification Search
CPC ................ G11C 29/023; G11C 29/028; G11C 29/50012
See application file for complete search history.

(56) References Cited

U.S. PATENT DOCUMENTS 7,000,138 B1 * 2/2006 Pillay ................. G06F 1/3203
713/600
2005/0135167 A1 6/2005 Manabe
(Continued)

FOREIGN PATENT DOCUMENTS

CN 101299203 A 11/2008
CN 106409343 A 2/2017
(Continued)

OTHER PUBLICATIONS

International Search Report and English Translation as cited in PCT/CN2021/103029 dated Sep. 28, 2021, 11 pages.
(Continued)

*Primary Examiner* — Mohammed A Bashar
(74) *Attorney, Agent, or Firm* — Cooper Legal Group, LLC

(57) ABSTRACT

The present disclosure provides a test system and a test method. The test system includes: a signal providing module, configured to provide a first clock signal and a second clock signal for a to-be-tested memory, the to-be-tested memory executes a write command based on the first clock signal, so that the to-be-tested memory stores preset data, and the to-be-tested memory executes a read command based on the second clock signal, to read storage data stored in the to-be-tested memory; and one of the first clock signal and the second clock signal is a symmetrical clock signal, and the other is an asymmetrical clock signal with a preset duty cycle; and a processing module, configured to obtain the storage data, and obtain a clock signal tolerance of the to-be-tested memory according to a comparison result between the storage data and the preset data.

14 Claims, 1 Drawing Sheet

(56) References Cited

U.S. PATENT DOCUMENTS

2008/0031055 A1    2/2008  Lee
2019/0042526 A1*  2/2019  Srivastava .......... G06F 13/4291

FOREIGN PATENT DOCUMENTS

CN      109960679 A    7/2019
CN      111597125 A    8/2020

OTHER PUBLICATIONS

Written Opinion and English Translation as cited in PCT/CN2021/103029 dated Sep. 28, 2021, 8 pages.

* cited by examiner

TEST SYSTEM AND TEST METHOD

CROSS-REFERENCE TO RELATED APPLICATIONS

The present disclosure is a continuation application of International Patent Application No. PCT/CN2021/103029, filed on Jun. 29, 2021, entitled "TEST SYSTEM AND TEST METHOD", which claims the priority to Chinese Patent Application No. 202010929507.0, titled "TEST SYSTEM AND TEST METHOD", filed with China National Intellectual Property Administration (CNIPA) on Sep. 7, 2020. The entire contents of International Patent Application No. PCT/CN2021/103029 and Chinese Patent Application No. 202010929507.0 are incorporated herein by reference.

TECHNICAL FIELD

The present disclosure relates to, but is not limited to, a test system and a test method.

BACKGROUND

A memory is operated based on a clock signal. However, the memory has no internal clock source to provide the clock signal, that is, the operation of the memory requires an externally input clock signal. Therefore, the memory needs to undergo a clock signal tolerance test.

If the memory operates on a rising edge, the clock signal tolerance test is to obtain a minimum duty cycle that enables normal operation of the memory. If the memory operates on a falling edge, the clock signal tolerance test is to obtain a maximum duty cycle that enables normal operation of the memory.

However, there are large errors in the clock signal tolerance test currently, and actual performance parameters of the memory cannot be obtained.

SUMMARY

Embodiments of the present disclosure provide a test system, including: a signal providing module, configured to provide a first clock signal and a second clock signal for a to-be-tested memory, the to-be-tested memory executes a write command based on the first clock signal, so that the to-be-tested memory stores preset data, and the to-be-tested memory executes a read command based on the second clock signal, to read storage data stored in the to-be-tested memory; and one of the first clock signal and the second clock signal is a symmetrical clock signal, and the other is an asymmetrical clock signal with a preset duty cycle; and a processing module, configured to obtain the storage data, and obtain a clock signal tolerance of the to-be-tested memory according to a comparison result between the storage data and the preset data.

The embodiments of the present disclosure further provide a test method, applied to a test machine, and including: obtaining preset data; when it is detected that the test machine sends a write command for a to-be-tested memory, providing a first clock signal for the to-be-tested memory, so that the to-be-tested memory stores the preset data; when it is detected that the test machine sends a read command for the to-be-tested memory, providing a second clock signal for the to-be-tested memory, to read storage data stored in the to-be-tested memory, one of the first clock signal and the second clock signal is a symmetrical clock signal, and the other is an asymmetrical clock signal with a preset duty cycle; obtaining the storage data; and comparing the storage data and the preset data, and obtaining a clock signal tolerance of the to-be-tested memory according to a comparison result between the storage data and the preset data.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are a part rather than all of the embodiments of the present disclosure. A person skilled in the art may obtain other drawings based on these drawings without creative efforts.

One or more embodiments are exemplified by corresponding accompanying drawings. The accompanying drawings are not limited by scale, unless otherwise specified.

DETAILED DESCRIPTION

Currently, there are large errors in a clock signal tolerance test, and actual performance parameters of a memory cannot be obtained.

To resolve the foregoing problem, a first embodiment of the present disclosure provides a test system, including: a signal providing module, configured to provide a first clock signal and a second clock signal for a to-be-tested memory, where the to-be-tested memory executes a write command based on the first clock signal, so that the to-be-tested memory stores preset data, and the to-be-tested memory executes a read command based on the second clock signal, to read storage data stored in the to-be-tested memory; and one of the first clock signal and the second clock signal is a symmetrical clock signal, and the other is an asymmetrical clock signal with a preset duty cycle; and a processing module, configured to obtain the storage data, and obtain a clock signal tolerance of the to-be-tested memory according to a comparison result between the storage data and the preset data.

In order to make the objectives, technical solutions, and advantages of the embodiments of the present disclosure clearer, the embodiments of the present disclosure are described in detail below with reference to the accompanying drawings. A person skilled in the art may understand that many technical details are proposed in the embodiments of the present disclosure to help readers better understand the present disclosure. However, even without these technical details and various changes and modifications made based on the following embodiments, the technical solutions claimed in the present disclosure can be realized. The following division of the embodiments is for convenience of description, and should not constitute any limitation on specific implementations of the present disclosure, and the embodiments can be combined with each other and referenced each other without contradiction.

Figure 1:
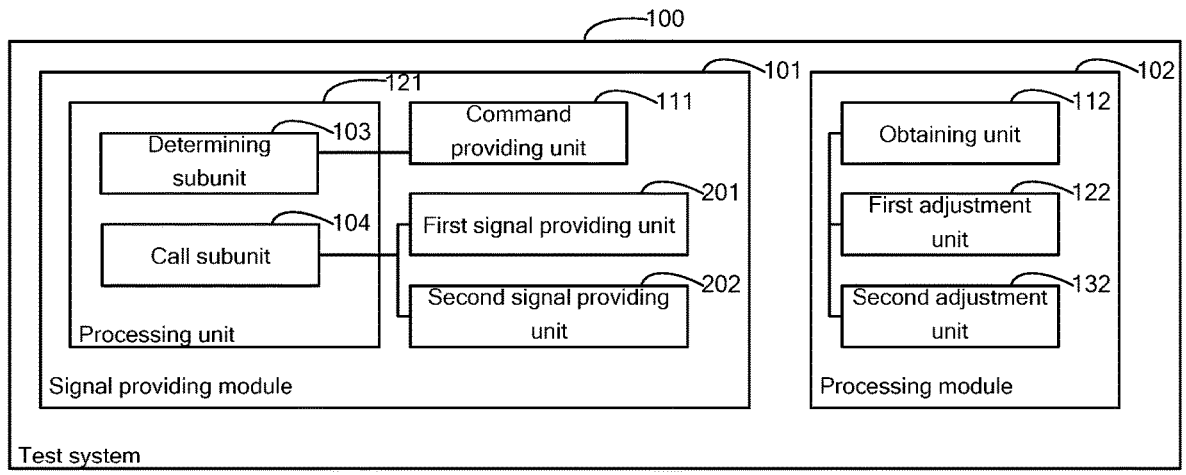
FIG. 1 is a schematic structural diagram of a test system according to a first embodiment of the present disclosure.

FIG. 1 is a schematic structural diagram of a test system according to an embodiment of the present disclosure. The test method provided in this embodiment is described below in detail with reference to the accompanying drawings.

Referring to FIG. 1, the test system 100 includes a signal providing module 101 and a processing module 102.

The signal providing module 101 is configured to provide a first clock signal and a second clock signal for a to-be-tested memory.

The to-be-tested memory executes a write command based on the first clock signal, so that the to-be-tested memory stores preset data. The to-be-tested memory executes a read command based on the second clock signal, to read storage data stored in the to-be-tested memory. The read storage data is the preset data stored according to the write command.

One of the first clock signal and the second clock signal is a symmetrical clock signal, and the other is an asymmetrical clock signal with a preset duty cycle. The symmetrical clock signal is a clock signal with a duty cycle of 50%. The asymmetrical clock signal is a clock signal with a duty cycle not equal to 50%.

The signal providing module 101 includes a command providing unit 111 and a processing unit 121.

The command providing unit 111 is configured to provide a control command for the to-be-tested memory, where the control command includes at least the write command and the read command.

The processing unit 121 is configured to detect the control command provided by the command providing unit 111 for the to-be-tested memory. When the write command is detected, the signal providing module 101 provides the first clock signal for the to-be-tested memory, and when the read command is detected, the signal providing module 101 provides the second clock signal for the to-be-tested memory.

The processing unit 121 includes a determining subunit 103 and a call subunit 104.

The determining subunit 103 is configured to send a first control signal to the call subunit 104 when the write command is detected. The call subunit 104 is configured to control, based on the first control signal, the signal providing module 101 to provide the first clock signal for the to-be-tested memory.

The determining subunit 103 is further configured to send a second control signal to the call subunit 104 when the read command is detected. The call subunit 104 is further configured to control, based on the second control signal, the signal providing module 101 to provide the second clock signal for the to-be-tested memory.

In this embodiment, the signal providing module 101 further includes a first signal providing unit 201 and a second signal providing unit 202.

During a tolerance test on the memory, if execution of both the read command and the write command is based on a symmetrical clock signal, the tolerance test on the memory cannot be implemented. If the execution of both the read command and the write command is based on an asymmetrical clock signal, because large errors exist in both a reading process and a writing process, a single reading/writing process based on the asymmetrical clock signal obtains a tolerance result, and two reading/writing processes based on the asymmetrical clock signal cause inaccurate signal tolerance test results.

In some embodiments of the present disclosure, the first signal providing unit 201 is configured to provide the first clock signal, where the first clock signal is an asymmetrical clock signal with a preset duty cycle. The second signal providing unit 202 is configured to provide the second clock signal, where the second clock signal is a symmetrical clock signal. In other words, the to-be-tested memory executes the write command by using the asymmetrical clock signal, and executes the read command by using the symmetrical clock signal.

In this embodiment, description is provided in detail by using an example in which three storage units in the to-be-tested memory are tested, and it is assumed that the preset data is 111. The to-be-tested memory executes the write command by using the asymmetrical clock signal. An interval time between each rising edge and falling edge of the asymmetrical clock signal is different, and there may be a timing in which data cannot be normally written. Consequently, the memory cannot operate normally. In other words, a data signal stored in the to-be-tested memory by using the asymmetrical clock signal is 101. The to-be-tested memory executes the read command by using the symmetrical clock signal. An interval time between each rising edge and falling edge of the symmetrical clock signal is the same, and the storage data in the to-be-tested memory can be completely read. In other words, based on the read command executed by using the symmetrical clock signal, the storage data in the to-be-tested memory can be correctly obtained. In this case, the read storage data is 101, and the storage data is different from the preset storage data. This indicates that the to-be-tested memory cannot operate normally under the asymmetrical clock signal with the current duty cycle.

The foregoing detailed description of the test principle of this embodiment in terms of the three storage units is intended to enable a person skilled in the art to understand the test principle of this embodiment, and does not constitute a limitation on this embodiment. In a specific use process, the foregoing test procedure may be performed according to a quantity of storage units that actually need to be tested.

In some embodiments of the present disclosure, the first signal providing unit 201 is configured to provide the first clock signal, where the first clock signal is a symmetrical clock signal. The second signal providing unit 202 is configured to provide the second clock signal, where the second clock signal is an asymmetrical clock signal with a preset duty cycle. In other words, the to-be-tested memory executes the write command by using the symmetrical clock signal, and executes the read command by using the asymmetrical clock signal.

In this embodiment, description is provided in detail by using an example in which three storage units in the to-be-tested memory are tested, and it is assumed that the preset data is 111. The to-be-tested memory executes the write command by using the symmetrical clock signal. An interval time between each rising edge and falling edge of the symmetrical clock signal is the same, and the preset storage data can be completely stored in the to-be-tested memory. In other words, based on the write command executed by using the symmetrical clock signal, the preset data can be correctly written in the to-be-tested memory. In this case, a data signal written in the to-be-tested memory is 111. The to-be-tested memory executes the read command by using the asymmetrical clock signal. An interval time between each rising edge and falling edge of the asymmetrical clock signal is different, and there may be a timing from which data cannot be normally read. Consequently, the memory cannot operate normally. In other words, a data signal stored in the to-be-tested memory and read out by using the asymmetrical clock signal is 101, and the storage data is different from the preset storage data. This indicates that the to-be-tested memory cannot operate normally under the asymmetrical clock signal with the current duty cycle.

The foregoing detailed description of the test principle of this embodiment in terms of the three storage units is intended to enable a person skilled in the art to understand the test principle of this embodiment, and does not constitute a limitation on this embodiment. In a specific use process, the foregoing test procedure may be performed according to a quantity of storage units that actually need to be tested.

The processing module 102 is configured to obtain the storage data, and obtain a clock signal tolerance of the to-be-tested memory according to a comparison result between the storage data and the preset data.

The processing module 102 includes: an obtaining unit 112, configured to obtain the storage data, and generate a clock adjustment signal according to the comparison result between the storage data and the preset data, where the signal providing module 101 adjusts the preset duty cycle based on the clock adjustment signal, until the clock signal tolerance of the to-be-tested memory is obtained.

In some embodiments of the present disclosure, if the to-be-tested memory operates on a rising edge, the clock signal tolerance is used to represent a minimum duty cycle of the asymmetrical clock signal when an error between the storage data and the preset data falls within a preset range. The error between the storage data and the preset data is a proportion of data in the storage data that is different from the preset data to total data in the storage data. Because the to-be-tested memory operates on the rising edge, that is, a high level is active, a smaller duty cycle of the asymmetrical clock signal indicates a shorter time for which the to-be-tested memory operates normally. In this way, the clock signal tolerance of the to-be-tested memory is obtained.

The processing module 102 further includes a first adjustment unit 122 and a second adjustment unit 132.

The first adjustment unit 122 is configured to decrease the preset duty cycle if the clock signal tolerance of the to-be-tested memory at the preset duty cycle represents that the to-be-tested memory operates normally.

The second adjustment unit 132 is configured to increase the preset duty cycle if the clock signal tolerance of the to-be-tested memory at the preset duty cycle represents that the to-be-tested memory cannot operate normally.

Based on a result of the tolerance test on the memory at the preset duty cycle in a previous test, an adjustment manner of the preset duty cycle is obtained to perform feedback adjustment on the preset duty cycle, to obtain the clock signal tolerance of the to-be-tested memory.

In some embodiments of the present disclosure, if the to-be-tested memory operates on a falling edge, the clock signal tolerance is used to represent a maximum duty cycle of the asymmetrical clock signal when an error between the storage data and the preset data falls within a preset range. The error between the storage data and the preset data is a proportion of data in the storage data that is different from the preset data to total data in the storage data. Because the to-be-tested memory operates on the falling edge, that is, a low level is active, a larger duty cycle of the asymmetrical clock signal indicates a shorter time for which the to-be-tested memory operates normally. In this way, the clock signal tolerance of the to-be-tested memory is obtained.

The processing module 102 further includes a first adjustment unit 122 and a second adjustment unit 132.

The first adjustment unit 122 is configured to increase the preset duty cycle if the clock signal tolerance of the to-be-tested memory at the preset duty cycle represents that the to-be-tested memory operates normally.

The second adjustment unit 132 is configured to decrease the preset duty cycle if the clock signal tolerance of the to-be-tested memory at the preset duty cycle represents that the to-be-tested memory cannot operate normally.

Based on a result of the tolerance test on the memory at the preset duty cycle in a previous test, an adjustment manner of the preset duty cycle is obtained to perform feedback adjustment on the preset duty cycle, to obtain the clock signal tolerance of the to-be-tested memory.

In this embodiment, switching between the first clock signal and the second clock signal is performed when the to-be-tested memory executes the read command and executes the write command. In other embodiments, switching between the first clock signal and the second clock signal may be performed in another timing between execution of the read command and execution of the write command.

The to-be-tested memory respectively executes the read command and the write command based on the symmetrical clock signal and the asymmetrical clock signal that are provided by the signal providing module. Based on the read command or the write command executed by the to-be-tested memory based on the symmetrical clock signal, the storage data in the to-be-tested memory can be completely read, or data that needs to be stored can be completely stored in the to-be-tested memory. Therefore, it can be learned that an error caused by the symmetrical clock signal is small. However, in terms of the read command or the write command executed by the to-be-tested memory based on the asymmetrical clock signal, because an interval time between each rising edge and falling edge of the asymmetrical clock signal is different, the memory may not be capable of normally reading data/writing data. Therefore, it can be learned that an error caused by the asymmetrical clock signal is large. Through a comparison test between the symmetrical clock signal and the asymmetrical clock signal, the processing module can accurately obtain an error caused by the memory operating under the asymmetrical clock signal, thereby accurately determining the clock signal tolerance of the memory.

Each module involved in this embodiment is a logical module. During actual application, a logical unit may be a physical unit, or may be a part of a physical unit, or may be implemented as a combination of a plurality of physical units. In addition, in order to highlight the innovative part of the present disclosure, units that are not closely related to resolving the technical problem proposed by the present disclosure are not introduced in this embodiment, but this does not indicate that there are no other units in this embodiment.

A second embodiment of the present disclosure relates to a test method.

Figure 2:
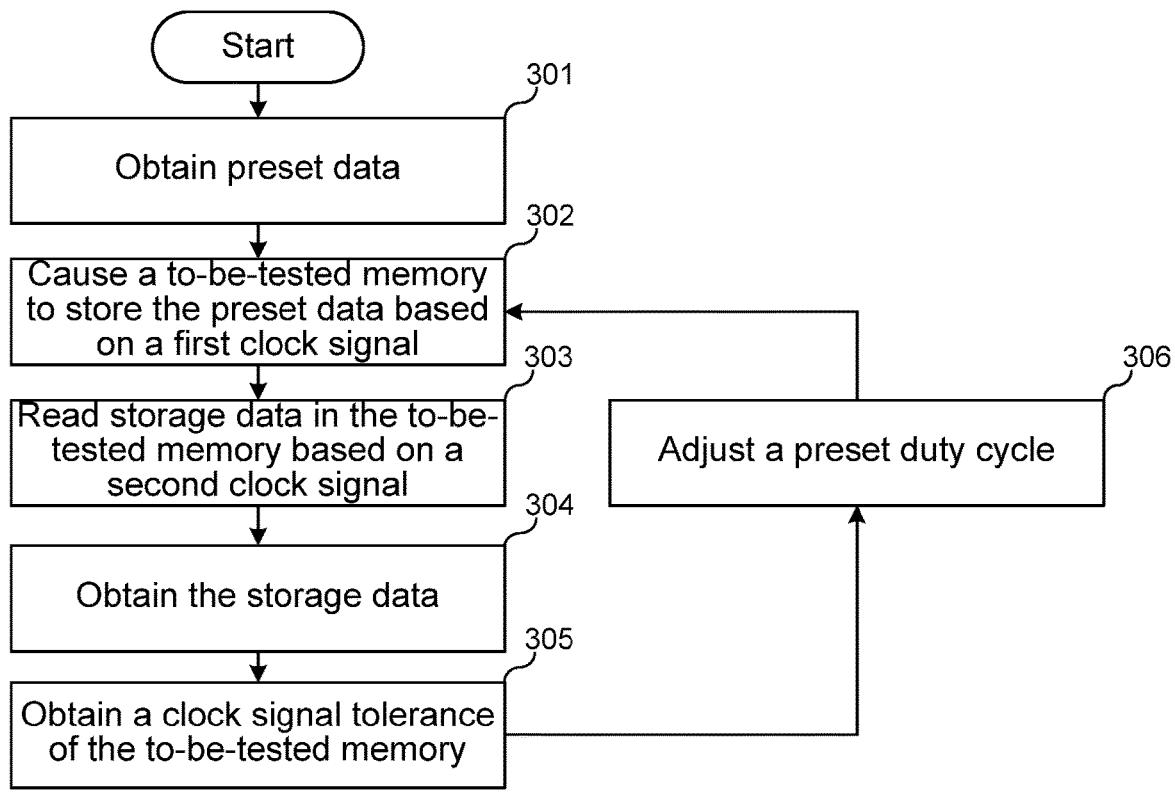
FIG. 2 is a schematic flowchart of a test method according to a second embodiment of the present disclosure.

FIG. 2 is a schematic flowchart of a test method according to an embodiment of the present disclosure. The test method provided in this embodiment is described below in detail with reference to the accompanying drawings. Parts that are the same as or corresponding to those in the first embodiment are not described in detail below.

Referring to FIG. 2, the test method is applied to a test machine, and includes:

Step 301. Obtain preset data.

The preset data is a data signal that needs to be stored in a to-be-tested memory during execution of a write command.

In some embodiments of the present disclosure, description is provided in detail by using an example in which three storage units in the to-be-tested memory are tested, and it is assumed that the preset data is 111.

Step 302. Cause the to-be-tested memory to store the preset data based on a first clock signal.

Step 303. Read storage data in the to-be-tested memory based on a second clock signal.

When it is detected that the test machine sends a write command for the to-be-tested memory, the first clock signal is provided for the to-be-tested memory, so that the to-be-tested memory stores the preset data. When it is detected that the test machine sends a read command for the to-be-tested memory, the second clock signal is provided for the to-be-tested memory, to read memory data stored in the to-be-tested memory.

One of the first clock signal and the second clock signal is a symmetrical clock signal, and the other is an asymmetrical clock signal.

Step 304. Obtain the storage data.

A memory data signal read by the to-be-tested memory based on the read command is obtained.

In some embodiments of the present disclosure, the to-be-tested memory executes the write command by using the asymmetrical clock signal. An interval time between each rising edge and falling edge of the asymmetrical clock signal is different. There may be a timing in which data cannot be normally written. Consequently, the memory cannot operate normally. In other words, a data signal stored in the to-be-tested memory by using the asymmetrical clock signal is 101. The to-be-tested memory executes the read command by using the symmetrical clock signal. An interval time between each rising edge and falling edge of the symmetrical clock signal is the same, and the storage data in the to-be-tested memory can be completely read. In other words, based on the read command executed by using the symmetrical clock signal, the storage data in the to-be-tested memory can be correctly obtained. In this case, the read storage data is 101.

In some embodiments of the present disclosure, the to-be-tested memory executes the write command by using the symmetrical clock signal. An interval time between each rising edge and falling edge of the symmetrical clock signal is the same, and the preset storage data can be completely stored in the to-be-tested memory. In other words, based on the write command executed by using the symmetrical clock signal, the preset data can be correctly written in the to-be-tested memory. In this case, a data signal written in the to-be-tested memory is 111. The to-be-tested memory executes the read command by using the asymmetrical clock signal. An interval time between each rising edge and falling edge of the asymmetrical clock signal is different, and there may be a timing from which data cannot be normally read. Consequently, the memory cannot operate normally. In other words, a data signal stored in the to-be-tested memory and read by using the asymmetrical clock signal is 101.

Through a comparison test between the symmetrical clock signal and the asymmetrical clock signal, an error caused by the memory under the asymmetrical clock signal can be accurately obtained, thereby accurately determining the clock signal tolerance of the memory.

Step 305. Obtain a clock signal tolerance of the to-be-tested memory.

The clock signal tolerance of the to-be-tested memory is obtained according to a comparison result between the storage data and the preset data.

In some embodiments of the present disclosure, if the to-be-tested memory operates on a rising edge, the clock signal tolerance is used to represent a minimum duty cycle of the asymmetrical clock signal when an error between the storage data and the preset data falls within a preset range. The error between the storage data and the preset data is a proportion of data in the storage data that is different from the preset data to total data in the storage data. Because the to-be-tested memory operates on the rising edge, that is, a high level is active, smaller duty cycles of the first clock signal and the second clock signal indicate a shorter time for which the to-be-tested memory operates normally. In this way, the clock signal tolerance of the to-be-tested memory is obtained.

In some embodiments of the present disclosure, if the to-be-tested memory operates on a falling edge, the clock signal tolerance is used to represent a maximum duty cycle of the asymmetrical clock signal when an error between the storage data and the preset data falls within a preset range. The error between the storage data and the preset data is a proportion of data in the storage data that is different from the preset data to total data in the storage data. Because the to-be-tested memory operates on the falling edge, that is, a low level is active, larger duty cycles of the first clock signal and the second clock signal indicate a shorter time for which the to-be-tested memory operates normally. In this way, the clock signal tolerance of the to-be-tested memory is obtained.

Step 306. Adjust a preset duty cycle.

The preset duty cycle is adjusted according to the clock signal tolerance of the to-be-tested memory at a current duty cycle.

In some embodiments of the present disclosure, if the to-be-tested memory operates on a rising edge, the preset duty cycle is to be adjusted in the following manner:

The preset duty cycle is to be decreased if the clock signal tolerance of the to-be-tested memory at the preset duty cycle represents that the to-be-tested memory operates normally. The preset duty cycle is to be increased if the clock signal tolerance of the to-be-tested memory at the preset duty cycle represents that the to-be-tested memory cannot operate normally.

In some embodiments of the present disclosure, if the to-be-tested memory operates on a falling edge, the preset duty cycle is to be adjusted in the following manner:

The preset duty cycle is to be increased if the clock signal tolerance of the to-be-tested memory at the preset duty cycle represents that the to-be-tested memory operates normally. The preset duty cycle is to be decreased if the clock signal tolerance of the to-be-tested memory at the preset duty cycle represents that the to-be-tested memory cannot operate normally.

Based on a result of the tolerance test on the memory at the preset duty cycle in a previous test, an adjustment manner of the preset duty cycle is obtained to perform feedback adjustment on the preset duty cycle, step 302 is further performed after the feedback adjustment, and the foregoing steps are repeated, to obtain the clock signal tolerance of the to-be-tested memory.

The foregoing detailed description of the test principle of this embodiment in terms of the three storage units is intended to enable a person skilled in the art to understand the test principle of this embodiment, and does not constitute a limitation on this embodiment. In a specific use process, the foregoing test procedure may be performed according to a quantity of storage units that actually need to be tested.

In this embodiment, switching between the first clock signal and the second clock signal is performed when the to-be-tested memory executes the read command and executes the write command. In other embodiments, switching between the first clock signal and the second clock signal may be performed in another timing between execution of the read command and execution of the write command.

The to-be-tested memory respectively executes the read command and the write command based on the symmetrical clock signal and the asymmetrical clock signal, where the read command or the write command executed by the to-be-tested memory based on the symmetrical clock signal can be used to completely read the storage data in the to-be-tested memory, or completely store, in the to-be-tested memory, data that needs to be stored. Therefore, it can be learned that an error caused by the symmetrical clock signal is small. However, the read command or the write command executed by the to-be-tested memory based on the asymmetrical clock signal, because an interval time between each rising edge and falling edge of the asymmetrical clock signal is different, the memory may not be capable of normally reading data/writing data. Therefore, it can be learned that an error caused by the asymmetrical clock signal is large. Through a comparison test between the symmetrical clock signal and the asymmetrical clock signal, an error caused by the memory operating under the asymmetrical clock signal can be accurately obtained, thereby accurately determining the clock signal tolerance of the memory.

The division of the foregoing various steps is only for clarity of description. During implementation, the steps can be combined into one step or some steps can be split into a plurality of steps, provided that a same logical relationship is included and the steps all fall within the scope of protection of this disclosure. Adding insignificant modifications to the procedures or introducing insignificant designs without changing the core design of the procedures all fall within the scope of protection of this disclosure.

As the first embodiment and this embodiment correspond to each other, this embodiment can be implemented in cooperation with the first embodiment. The related technical details mentioned in the first embodiment are still valid in this embodiment, and the technical effects that can be achieved in the first embodiment can also be achieved in this embodiment. In order to reduce repetition, details are not described herein. Correspondingly, the related technical details mentioned in this embodiment can also be applied to the first embodiment.

A person skilled in the art can easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

INDUSTRIAL APPLICABILITY

According to the test system and the test method provided in the present disclosure, through a comparison test between the symmetrical clock signal and the asymmetrical clock signal, an error caused by the memory operating under the asymmetrical clock signal can be accurately obtained, thereby accurately determining the clock signal tolerance of the memory.

The invention claimed is:

1. A test system, wherein the test system comprises:
   a signal providing module, configured to provide a first clock signal and a second clock signal for a to-be-tested memory, wherein
   the to-be-tested memory executes a write command based on the first clock signal, so that the to-be-tested memory stores preset data, and the to-be-tested memory executes a read command based on the second clock signal, to read storage data stored in the to-be-tested memory; and
   one of the first clock signal and the second clock signal is a symmetrical clock signal, and the other is an asymmetrical clock signal with a preset duty cycle; and
   a processing module, configured to obtain the storage data, and obtain a clock signal tolerance of the to-be-tested memory according to a comparison result between the storage data and the preset data.

2. The test system according to claim 1, wherein the signal providing module comprises:
   a command providing unit, configured to provide a control command for the to-be-tested memory, wherein the control command comprises at least the write command and the read command; and
   a processing unit, configured to detect the control command provided by the command providing unit for the to-be-tested memory, wherein
   when the write command is detected, the signal providing module provides the first clock signal for the to-be-tested memory, and when the read command is detected, the signal providing module provides the second clock signal for the to-be-tested memory.

3. The test system according to claim 2, wherein the processing unit comprises:
   a determining subunit, configured to send a first control signal to a call subunit when the write command is detected, and send a second control signal to the call subunit when the read command is detected; and
   the call subunit, configured to control, based on the first control signal, the signal providing module to provide the first clock signal for the to-be-tested memory; and control, based on the second control signal, the signal providing module to provide the second clock signal for the to-be-tested memory.

4. The test system according to claim 1, wherein the signal providing module comprises a first signal providing unit and a second signal providing unit, wherein
   the first signal providing unit is configured to provide the first clock signal, wherein the first clock signal is the asymmetrical clock signal with the preset duty cycle; and
   the second signal providing unit is configured to provide the second clock signal, wherein the second clock signal is the symmetrical clock signal.

5. The test system according to claim 1, wherein the signal providing module comprises a first signal providing unit and a second signal providing unit, wherein
   the first signal providing unit is configured to provide the first clock signal, wherein the first clock signal is the symmetrical clock signal; and
   the second signal providing unit is configured to provide the second clock signal, wherein the second clock signal is the asymmetrical clock signal with the preset duty cycle.

6. The test system according to claim 1, wherein the processing module comprises:
   an obtaining unit, configured to obtain the storage data, and generate a clock adjustment signal according to the comparison result between the storage data and the preset data, wherein
   the signal providing module adjusts the preset duty cycle based on the clock adjustment signal, until the clock signal tolerance of the to-be-tested memory is obtained.

7. The test system according to claim 6, wherein if the to-be-tested memory operates on a rising edge, the clock signal tolerance is used to represent a minimum duty cycle of the asymmetrical clock signal when an error between the storage data and the preset data falls within a preset range.

8. The test system according to claim 7, wherein the processing module comprises:
   a first adjustment unit, configured to decrease the preset duty cycle of the asymmetrical clock signal if the clock signal tolerance of the to-be-tested memory at a current duty cycle represents that the to-be-tested memory operates normally; and
   a second adjustment unit, configured to increase the preset duty cycle of the asymmetrical clock signal if the clock signal tolerance of the to-be-tested memory at the current duty cycle represents that the to-be-tested memory cannot operate normally.

9. The test system according to claim 6, wherein if the to-be-tested memory operates on a falling edge, the clock signal tolerance is used to represent a maximum duty cycle of the asymmetrical clock signal when an error between the storage data and the preset data falls within a preset range.

10. The test system according to claim 9, wherein the processing module comprises:
    a first adjustment unit, configured to increase the preset duty cycle of the asymmetrical clock signal if the clock signal tolerance of the to-be-tested memory at a current duty cycle represents that the to-be-tested memory operates normally; and
    a second adjustment unit, configured to decrease the preset duty cycle of the asymmetrical clock signal if the clock signal tolerance of the to-be-tested memory at the current duty cycle represents that the to-be-tested memory cannot operate normally.

11. A test method, applied to a test machine, wherein the test method comprises:
    obtaining preset data;
    when it is detected that the test machine sends a write command for a to-be-tested memory, providing a first clock signal for the to-be-tested memory, so that the to-be-tested memory stores the preset data;
    when it is detected that the test machine sends a read command for the to-be-tested memory, providing a second clock signal for the to-be-tested memory, to read storage data stored in the to-be-tested memory, wherein
    one of the first clock signal and the second clock signal is a symmetrical clock signal, and the other is an asymmetrical clock signal with a preset duty cycle;
    obtaining the storage data; and
    comparing the storage data and the preset data, and obtaining a clock signal tolerance of the to-be-tested memory according to a comparison result between the storage data and the preset data.

12. The test method according to claim 11, wherein the test method further comprises:
    adjusting the preset duty cycle according to the clock signal tolerance of the to-be-tested memory at the preset duty cycle.

13. The test method according to claim 12, wherein the adjusting the preset duty cycle according to the clock signal tolerance of the to-be-tested memory at the preset duty cycle comprises:
    if the to-be-tested memory operates on a rising edge, adjusting the preset duty cycle in the following manner:
    decreasing the preset duty cycle if the clock signal tolerance of the to-be-tested memory represents, based on the asymmetrical clock signal with the preset duty cycle, that the to-be-tested memory operates normally; and
    increasing the preset duty cycle if the clock signal tolerance of the to-be-tested memory represents, based on the asymmetrical clock signal with the preset duty cycle, that the to-be-tested memory cannot operate normally.

14. The test method according to claim 12, wherein the adjusting the preset duty cycle according to the clock signal tolerance of the to-be-tested memory at the preset duty cycle comprises:
    if the to-be-tested memory operates on a falling edge, adjusting the preset duty cycle in the following manner:
    increasing the preset duty cycle if the clock signal tolerance of the to-be-tested memory represents, based on the asymmetrical clock signal with the preset duty cycle, that the to-be-tested memory operates normally; and
    decreasing the preset duty cycle if the clock signal tolerance of the to-be-tested memory represents, based on the asymmetrical clock signal with the preset duty cycle, that the to-be-tested memory cannot operate normally.

* * * * *